(12) United States Patent
Zhang et al.

(10) Patent No.: US 12,310,179 B2
(45) Date of Patent: May 20, 2025

(54) DISPLAY SUBSTRATE, PREPARATION METHOD THEREOF, AND DISPLAY APPARATUS

(71) Applicant: BOE Technology Group Co., Ltd., Beijing (CN)

(72) Inventors: Yue Zhang, Beijing (CN); Ying Cui, Beijing (CN); Li Sun, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 570 days.

(21) Appl. No.: 17/634,558

(22) PCT Filed: Mar. 30, 2021

(86) PCT No.: PCT/CN2021/083843
§ 371 (c)(1),
(2) Date: Feb. 11, 2022

(87) PCT Pub. No.: WO2022/204918
PCT Pub. Date: Oct. 6, 2022

(65) Prior Publication Data
US 2023/0363203 A1    Nov. 9, 2023

(51) Int. Cl.
*H10K 59/121* (2023.01)
*H10K 59/12* (2023.01)
(Continued)

(52) U.S. Cl.
CPC ..... *H10K 59/1213* (2023.02); *H10K 59/1201* (2023.02); *H10K 59/122* (2023.02); *H10K 59/353* (2023.02); *H10K 71/135* (2023.02)

(58) Field of Classification Search
CPC ............. H10K 59/122; H10K 59/1231; H10K 59/1201; H10K 59/353; H10K 59/135;
(Continued)

(56) References Cited

U.S. PATENT DOCUMENTS

| | | |
|---|---|---|
| 2007/0132356 A1 | 6/2007 | Hashimoto et al. |
| 2011/0198598 A1 | 8/2011 | Kim et al. |

(Continued)

FOREIGN PATENT DOCUMENTS

| | | |
|---|---|---|
| CN | 106876437 A | 6/2017 |
| CN | 108346679 A | 7/2018 |

(Continued)

*Primary Examiner* — Shahed Ahmed
*Assistant Examiner* — Rhys Poniente Sheker
(74) *Attorney, Agent, or Firm* — Ling Wu; Stephen Yang; Ling and Yang Intellectual Property

(57) ABSTRACT

Provided are a display substrate, a preparation method thereof and a display apparatus. The display substrate includes a substrate, a drive circuit layer disposed on the substrate and a light emitting structure layer disposed on a side of the drive circuit layer away from the substrate, wherein the drive circuit layer includes a transistor, and the light emitting structure layer includes a first electrode, a pixel define layer, an organic light emitting layer and a second electrode, wherein the first electrode is connected with a drain electrode of the transistor, and the organic light emitting layer is located between the first electrode and the second electrode; the pixel define layer includes a plurality of first retaining walls and a plurality of second retaining walls.

20 Claims, 9 Drawing Sheets

(51) Int. Cl.
*H10K 59/122* (2023.01)
*H10K 59/35* (2023.01)
*H10K 71/13* (2023.01)

(58) Field of Classification Search
CPC ......... H10K 59/10–221; H10K 59/173; H10K 71/135; H10K 71/00–861; H10K 50/00–88
See application file for complete search history.

(56) References Cited

U.S. PATENT DOCUMENTS

| | | | |
|---|---|---|---|
| 2019/0074330 A1 | 3/2019 | Wang | |
| 2020/0066814 A1* | 2/2020 | Song | H10K 59/122 |
| 2020/0091254 A1* | 3/2020 | Cui | H10K 59/122 |
| 2020/0135816 A1* | 4/2020 | Cui | H10K 71/135 |
| 2021/0202609 A1* | 7/2021 | Park | H10K 59/352 |
| 2021/0376018 A1* | 12/2021 | Luo | H10K 59/173 |
| 2022/0045138 A1 | 2/2022 | Han et al. | |

FOREIGN PATENT DOCUMENTS

| | | |
|---|---|---|
| CN | 109273499 A | 1/2019 |
| CN | 111312776 A | 6/2020 |
| CN | 111341925 A | 6/2020 |
| CN | 111463353 A | 7/2020 |
| CN | 111863908 A | 10/2020 |

\* cited by examiner

DISPLAY SUBSTRATE, PREPARATION METHOD THEREOF, AND DISPLAY APPARATUS

CROSS-REFERENCE TO RELATED APPLICATION

The present application is a U.S. National Phase Entry of International Application No. PCT/CN2021/083843 having an international filing date of Mar. 30, 2021. The above-identified application is hereby incorporated by reference.

TECHNICAL FIELD

Embodiments of the present disclosure relate to, but are not limited to, the field of display technology, in particular to a display substrate and a preparation method thereof, and a display apparatus.

BACKGROUND

An Organic Light Emitting Diode (OLED) is an active light emitting display apparatus, which has advantages such as self-luminescence, wide angle of view, high contrast, low power consumption, extremely high response speed, lightness and thinness, flexibility, and low cost. With continuous development of the display technology, a flexible display apparatus with OLEDs as light emitting devices and thin film Transistors (TFTs) for performing signal controlling has become a mainstream product in the current display field.

SUMMARY

The below is a summary about the subject matter described in the present disclosure in detail. The summary is not intended to limit the scope of protection of the claims.

The present disclosure provides a display substrate, which includes a substrate, a drive circuit layer disposed on the substrate and a light emitting structure layer disposed on a side of the drive circuit layer away from the substrate, wherein the drive circuit layer includes a transistor, and the light emitting structure layer includes a first electrode, a pixel define layer, an organic light emitting layer and a second electrode, wherein the first electrode is connected with a drain electrode of the transistor, and the organic light emitting layer is located between the first electrode and the second electrode; the pixel define layer includes a plurality of first retaining walls and a plurality of second retaining walls, wherein a height of the first retaining walls is less than a height of the second retaining walls; the first retaining walls and the second retaining walls are intersected to define a plurality of pixel opening regions; the pixel opening regions includes a first pixel opening region and a second pixel opening region; the area of the first pixel opening region is larger than the area of the second pixel opening region; and adjacent first pixel opening region and second pixel opening region are separated by a first retaining wall.

In an exemplary embodiment, the second retaining walls extend along a second direction, the plurality of second retaining walls are disposed in sequence along a first direction, and the plurality of first retaining walls are disposed in sequence along the second direction between two adjacent second retaining walls, wherein the first direction and the second direction are intersected; the second retaining wall includes a first sub-retaining wall and a second sub-retaining wall disposed at intervals, wherein the first sub-retaining wall is provided with a plurality of first bending parts and a plurality of second extending parts which are alternately disposed; the first bending parts extend in the first direction, and the second extending parts extend in the second direction.

In an exemplary embodiment, two adjacent first bending parts of the same first sub-retaining wall, a second extending part between two adjacent first bending parts, a second sub-retaining wall adjacent to the first sub-retaining wall and a first retaining wall between the first sub-retaining wall and the second sub-retaining wall enclose a first pixel opening region; and a second extending part between the two adjacent first bending parts of the same first sub-retaining wall, a second sub-retaining wall adjacent to the first sub-retaining wall and a first retaining wall between the first sub-retaining wall and the second sub-retaining wall enclose a second pixel opening region.

In an exemplary embodiment, the bending times and bending directions of the plurality of first bending parts of the first sub-retaining wall are the same.

In an exemplary embodiment, a width of the second retaining walls along the first direction is between ⅓ and ⅔ of a width of the first bending parts along the first direction.

In an exemplary embodiment, a height of the first retaining wall is less than or equal to 1 micron, and a height of the second retaining wall is 1.2 microns to 1.5 microns.

In an exemplary embodiment, a width of the first retaining wall is less than a width of the second retaining wall.

In an exemplary embodiment, the first retaining wall is made of a lyophilic material and the second retaining wall is made of a lyophobic material.

In an exemplary embodiment, the widths of first electrodes of all sub-pixels along the first direction are the same, the first electrodes of all sub-pixels are disposed in a matrix along the first direction and the second direction, the distances between the first electrodes of adjacent rows are equal, and a distance between the first electrode in the (2n+1)-th column and the first electrode in the (2n+2)-th column is greater than a distance between the first electrode in the (2n+2)-th column and the first electrode in the (2n+3)-th column, where n is an integer greater than or equal to 0.

In an exemplary embodiment, the first pixel opening region includes an light emitting region and a non-light emitting region, and the second pixel opening region only includes an light emitting region; an orthographic projection of the emitting region on the substrate is overlapped with an orthographic projection of a first electrode on the substrate, and an orthographic projection of the non-light emitting region on the substrate is not overlapped with an orthographic projection of the first electrode on the substrate.

In an exemplary embodiment, the widths of first electrodes of adjacent sub-pixels along a first direction are different, the first electrodes of all sub-pixels are disposed in a matrix along the first direction and a second direction, the distances between the first electrodes of adjacent rows are equal, and the distances between the first electrodes of adjacent columns are equal.

In an exemplary embodiment, a width of the second pixel opening region along the first direction is between ⅓ and ⅔ of a width of the first pixel opening region along the first direction.

The present disclosure further provides a display apparatus, which includes the above display substrate.

The present disclosure further provides a method for manufacturing a display substrate, including: a drive circuit layer including a transistor is formed on a substrate; a light emitting structure layer is formed on the drive circuit layer, wherein the light emitting structure layer includes a first electrode, a pixel define layer, an organic light emitting layer and a second electrode, wherein the first electrode is connected with a drain electrode of the transistor, and the organic light emitting layer is located between the first electrode and the second electrode; the pixel define layer includes a plurality of first retaining walls and a plurality of second retaining walls, wherein a height of the first retaining wall is less than a height of the second retaining wall; the first retaining walls and the second retaining walls are intersected to define a plurality of pixel opening regions; the pixel opening region includes a first pixel opening region and a second pixel opening region; the area of the first pixel opening region is larger than the area of the second pixel opening region; and adjacent first pixel opening region and second pixel opening region are separated by a first retaining wall.

In an exemplary embodiment, forming the light emitting structure layer on the drive circuit layer, includes: a first electrode pattern is formed on the drive circuit layer; a pixel define layer pattern is formed through a halftone mask patterning process; an organic light emitting layer pattern is formed through an inkjet printing process, wherein during inkjet printing, the organic light emitting layer material ink is only printed to the first pixel opening region; and a second electrode pattern is formed on the organic light emitting layer.

In an exemplary embodiment, forming a light emitting structure layer on the drive circuit layer, includes: a first electrode pattern is formed on the drive circuit layer; a first retaining wall pattern in a pixel define layer is formed through a first monochromatic mask patterning process; a second retaining wall pattern in the pixel define layer is formed through a second monochromatic mask patterning process; an organic light emitting layer pattern is formed through an inkjet printing process, wherein during inkjet printing, the organic light emitting layer material ink is only printed to the first pixel opening region; and a second electrode pattern is formed on the organic light emitting layer.

In an exemplary embodiment, forming an organic light emitting layer pattern through an inkjet printing process includes any one or more of the following: hole injection material ink is inkjet printed on the first pixel opening region, the hole injection material ink is flowed to the second pixel opening region adjacent to the first pixel opening region, the solvent of the hole injection material ink is removed by drying, and a hole injection layer pattern is formed by baking; hole transport material ink is inkjet printed on the first pixel opening region, the hole transport material ink is flowed to the second pixel opening region adjacent to the first pixel opening region, the solvent of the hole transport material ink is removed by drying, and a hole transport layer pattern is formed by baking; and luminescent material ink is inkjet printed on the first pixel opening region, the luminescent material ink is flowed to the second pixel opening region adjacent to the first pixel opening region, the solvent of the luminescent material ink is removed by drying, and an emitting layer pattern is formed by baking.

In an exemplary embodiment, the second retaining wall extends along a second direction, the plurality of second retaining walls are disposed in sequence along a first direction, and the plurality of first retaining walls are disposed in sequence along the second direction between two adjacent second retaining walls, wherein the first direction and the second direction are intersected; the second retaining wall includes a first sub-retaining wall and a second sub-retaining wall disposed at intervals, wherein the first sub-retaining wall is provided with a plurality of first bending parts and a plurality of second extending parts which are alternately disposed; the first bending parts extend in the first direction, and the second extending parts extend in the second direction.

After reading and understanding the drawings and the detailed description, other aspects may be understood.

BRIEF DESCRIPTION OF DRAWINGS

The drawings provide a further understanding to the technical solution of the present disclosure, form a part of the specification, and are adopted to explain, together with the embodiments of the present disclosure, the technical solutions of the present disclosure, and not intended to form limits to the technical solutions of the present disclosure. The shapes and sizes of each component in the drawings do not reflect the true scale, and are only intended to schematically describe the contents of the present disclosure.

DETAILED DESCRIPTION

Figure 1:
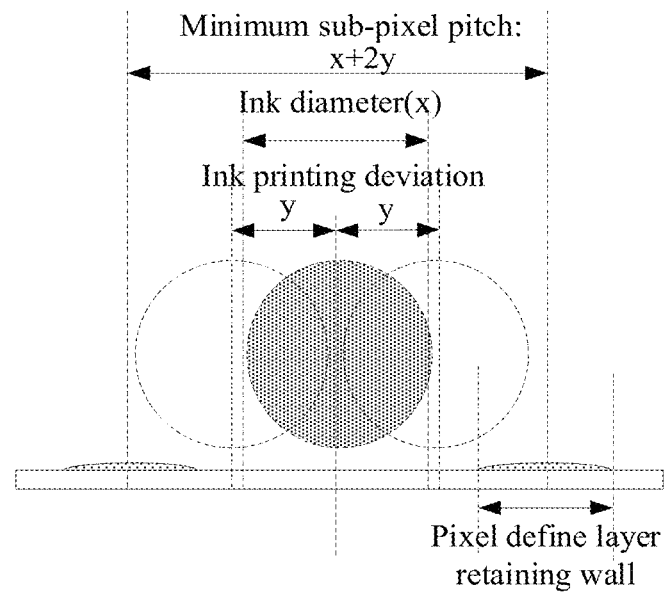
FIG. 1 is a schematic diagram of the calculation principle of the maximum display resolution of a substrate printable by a printing device.

To make the objects, technical solutions and advantages of the present disclosure more clear, embodiments of the present disclosure will be described in detail below with reference to the drawings. It is to be noted that implementations may be implemented in various forms. Those of ordinary skill in the art can easily understand such a fact that manners and contents may be transformed into various forms without departing from the purpose and scope of the present disclosure. Therefore, the present disclosure should not be explained as being limited to the contents recorded in the following implementations only. The embodiments in the present disclosure and the features in the embodiments can be freely combined in a case of no conflicts.

In the drawings, sometimes for clarity, the size of the constituent elements, the thickness of the layer or the area may be exaggerated. Therefore, a mode of the present disclosure is not always limited to the size and the shapes and sizes of each component in the drawings do not reflect the true scale. In addition, the drawings schematically illustrate ideal examples, and a mode of the present disclosure is not limited to the shapes, numerical values, or the like shown in the drawings.

"First", "second", "third" and other ordinal numerals in the specification are set to avoid the confusion of the constituent elements, rather than to limit the quantity.

For convenience, in the specification the terms such as "middle", "up", "down", "front", "back", "vertical", "horizontal", "top", "bottom", "inside" and "outside" indicating the orientation or position relationship are used to describe the position relationship between the constituent elements with reference to the drawings, only for the convenience of describing the specification and simplifying the description, instead of indicating or implying that the device or element referred to must have a specific orientation or be constructed and operated in a specific orientation, so they should not be understood as limitations to the present disclosure. The position relationship between the constituent elements may be appropriately varied according to the direction of the described constituent elements. Therefore, appropriate replacements based on situations are allowed, not limited to the expressions in the specification.

Unless otherwise specified and limited, in the specification the terms "mount", "connected" and "connect" should be understood in a broad sense. For example, it may be fixed connection, removable connection, or integrated connection; it may be mechanical connection or electrical connection; it may be direct connection, indirect connection through an intermediate component, or communication inside two components. For those skilled in the art, the specific meanings of the above terms in the present disclosure can be understood according to the actual situation.

In the specification, a transistor refers to a component which at least includes three terminals, i.e., a gate electrode, a drain electrode and a source electrode. The transistor has a channel region between the drain electrode (drain electrode terminal, drain region, or drain) and the source electrode (source electrode terminal, source region, or source), and a current may flow through the drain electrode, the channel region, and the source electrode. It is to be noted that, in the present specification, the channel region refers to a main region that the current flows through.

In the present specification, the first electrode may be the drain electrode, and the second electrode may be the source electrode. Alternatively, the first electrode may be the source electrode, and the second electrode may be the drain electrode. In cases that transistors with opposite polarities are used, or a current direction changes during work of a circuit, or the like, functions of the "source electrode" and the "drain electrode" may sometimes be exchanged. Therefore, the "source electrode" and the "drain electrode" may be exchanged in the present specification.

In this specification, an "electrical connection" includes a case where constituent elements are connected together through an element with a certain electric action. "The element with the certain electric action" is not particularly limited as long as electric signals between the connected constituent elements may be sent and received. Examples of "the element with the certain electric action" not only include an electrode and wire, but also include a switch element (such as a transistor), a resistor, an inductor, a capacitor, other elements with various functions, etc.

In the specification, "parallel" refers to a state in which an angle formed by two straight lines is more than −10° and less than 10°. Thereby, it also includes a state in which an angle is more than −5° and less than 5°. In addition, "vertical" refers to a state in which an angle formed by two straight lines is more than 80° and less than 100°. Therefore, it also includes a state in which an angle is more than 85° and less than 95°.

In this specification, "film" and "layer" may be interchangeable. For example, sometimes "conducting layer" may be replaced by "conducting film". Similarly, sometimes "insulating film" may be replaced by "insulating layer".

In the present disclosure, "about" refers to that a boundary is defined not so strictly and numerical values in process and measurement error ranges are allowed.

Film formation approaches of an OLED mainly include a vapor deposition process or a solution process. The vapor deposition process is relatively mature in small-size applications, and at present it has been applied in mass production. The OLED film formation approach of solution process mainly includes inkjet printing, nozzle coating, spin coating, screen printing, etc. Among them, the inkjet printing technology is considered as an important way to achieve mass production of large-size OLEDs due to its high material utilization and a capability of large-size implementation.

At present, high-resolution OLED devices have become a development trend. However, for OLED devices for inkjet printing, the resolution is restricted by the size of a printer nozzle. As shown in FIG. 1, generally speaking, the formula for calculating the maximum resolution that printing device can print is as follows:

$$PPI = \frac{1 \text{ inch}}{(\text{Ink drop diamter} + \text{impact accuracy} * 2) * 3}$$

If the printer is used to print a display substrate with a resolution higher than the highest resolution that it can print, there will be a risk of ink overflow.

An embodiment of the present disclosure provides a display substrate, which includes a substrate, a drive circuit layer disposed on the substrate and a light emitting structure layer disposed on a side of the drive circuit layer away from the substrate, wherein the drive circuit layer includes a transistor, and the light emitting structure layer includes a first electrode, a pixel define layer, an organic light emitting layer and a second electrode, wherein the first electrode is connected with a drain electrode of the transistor, and the organic light emitting layer is located between the first electrode and the second electrode;

the pixel define layer includes a plurality of first retaining walls and a plurality of second retaining walls, wherein a height of the first retaining wall is less than a height of the second retaining wall; the first retaining wall and the second retaining wall intersect to define a plurality of pixel opening regions; the pixel opening region includes a first pixel opening region and a second pixel opening region; the area of the first pixel opening region is larger than the area of the second pixel opening region; and two adjacent first pixel opening region and second pixel opening region are separated by a first retaining wall.

According to the display substrate in the embodiments of the present disclosure, a first pixel opening region and a second pixel opening region with different areas are enclosed by two kinds of retaining walls with different heights, so that ink is only printed to the first pixel opening region during inkjet printing. Because a first retaining wall has a lower height, the ink in the first pixel opening region can flow into the adjacent second pixel opening region, thus effectively avoiding the problem of low pixel resolution caused by ink overflow, which considerably alleviates the poor process and increases the processing yield. In addition, a distance between adjacent sub-pixel openings can be made smaller to better improve the resolution and display quality.

Figure 2:
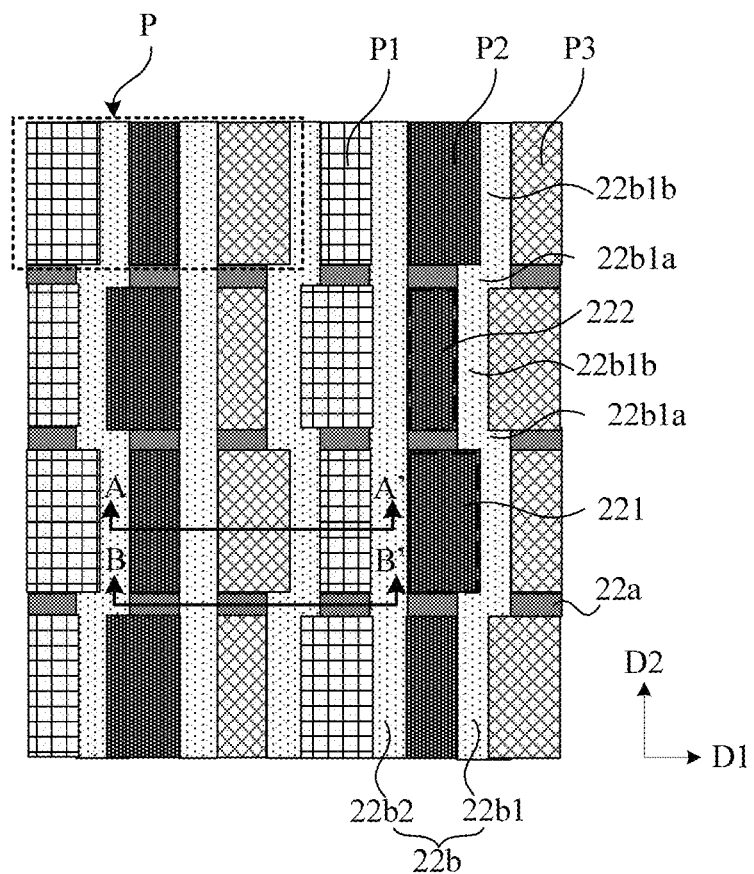
FIG. 2 is a schematic diagram of a structure of a display substrate according to an exemplary embodiment of the present disclosure.
Figure 3:
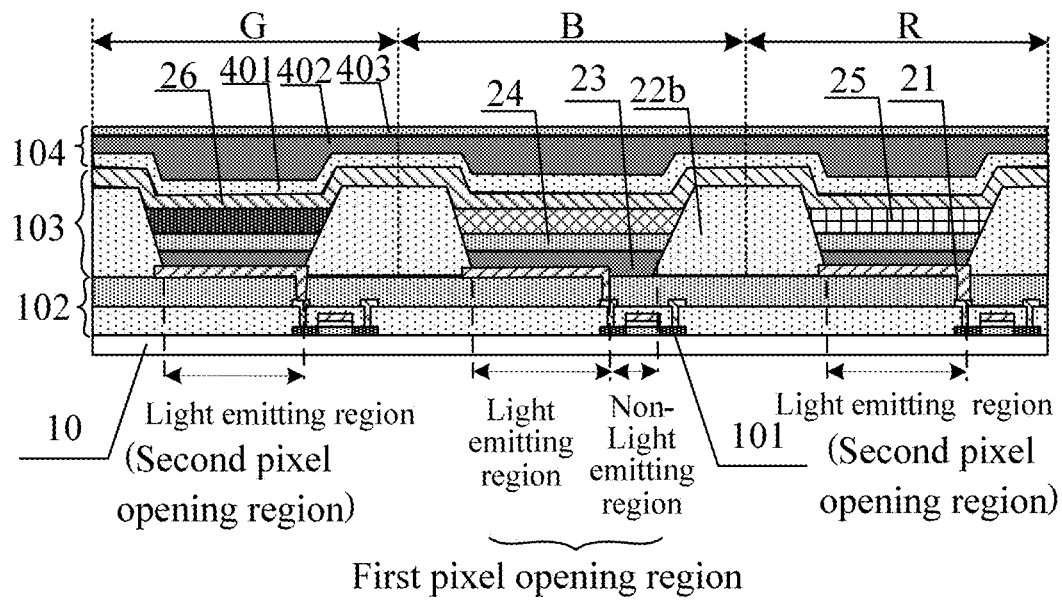
FIGS. 3 and 4 are schematic diagrams of two cross-sectional structures of an AA' region shown in FIG. 2.
Figure 4:
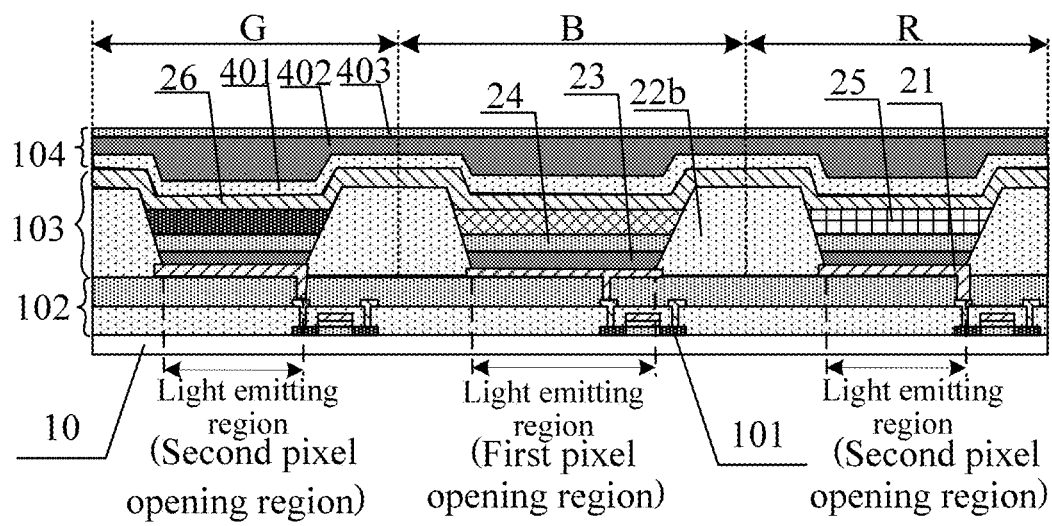
Figure 5:
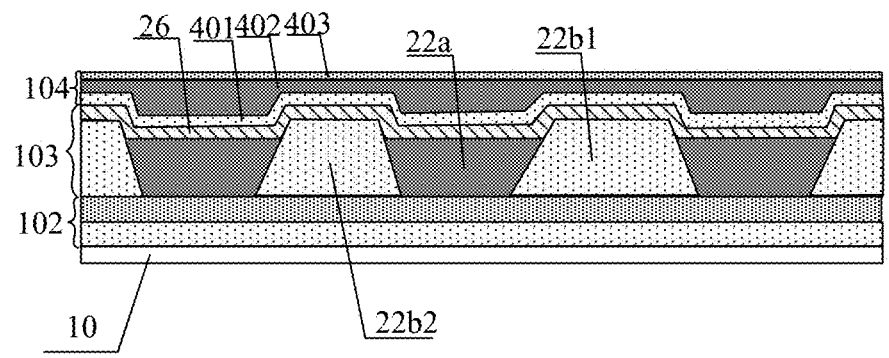
FIG. 5 is a schematic view of two cross-sectional structures of BB' region shown in FIG. 2.

FIG. 2 is a schematic diagram of a plane structure of a display substrate according to an embodiment of the present disclosure, FIGS. 3 and 4 are schematic views of two cross-sectional structures of AA' region of the display substrate shown in FIG. 2, and FIG. 5 is a schematic diagram of a cross-sectional structure of BB region of the display substrate shown in FIG. 2. As shown in FIGS. 2 to 5, a display substrate may include a plurality of pixel units P disposed in a matrix manner. At least one of the plurality of pixel units P includes a first light emitting unit (sub-pixel) P1 that emits light of a first color, a second light emitting unit P2 that emits light of a second color and a third light emitting unit P3 that emits light of a third color. The first light emitting unit P1, the second light emitting unit P2 and the third light emitting unit P3 each include a pixel circuit and a light emitting device. The pixel drive circuits in the first light emitting unit P1, the second light emitting unit P2, and the third light emitting unit P3 are respectively connected to scanning signal lines, data signal lines, and light emitting signal lines. The pixel drive circuits are configured to receive the data voltages transmitted by the data signal lines and output corresponding currents to the light emitting devices under the control of the scanning signal lines and the light emitting signal lines. The light emitting devices in the first light emitting unit P1, the second light emitting unit P2, and the third light emitting unit P3 are respectively connected to the pixel drive circuits of the light emitting units, and the light emitting devices are configured to emit light of corresponding brightness in response to the current outputs by the pixel drive circuits of the corresponding light emitting units where the light emitting devices are located.

In an exemplary embodiment, a pixel unit P may include a red (R) light emitting unit, a green (G) light emitting unit, and a blue (B) light emitting unit, or may include a red light emitting unit, a green light emitting unit, a blue light emitting unit, and a white light emitting unit, which is not limited in the present disclosure. In an exemplary embodiment, a shape of the light emitting units in the pixel unit may be a rectangle, a rhombus, a pentagon, or a hexagon. When the pixel unit includes three light emitting units, the three light emitting units may be disposed in parallel horizontally, in parallel vertically, or in a regular triangle shape. When the pixel unit includes four light emitting units, the four light emitting units may be disposed in parallel horizontally, in parallel vertically, or in a square shape, which is not limited in the present disclosure.

FIGS. 3 to 4 only illustrate structures of three sub-pixels in the display substrate. Referring to FIG. 3 or FIG. 4, on a plane perpendicular to the display substrate, the display substrate may include a drive circuit layer 102 disposed on a substrate 10, a light emitting structure layer 103 disposed on a side of the drive circuit layer 102 away from the substrate 10, and an encapsulation layer 104 disposed on a side of the light emitting structure layer 103 away from the substrate 10. In some possible embodiments, the display substrate may include other film layers, such as post spacers, which is not limited in the present disclosure.

In an exemplary embodiment, the substrate 10 may be a flexible substrate or may be a rigid substrate. The drive circuit layer 102 of each sub-pixel may include a plurality of transistors and storage capacitors forming a pixel drive circuit. In FIG. 3, illustration is made by taking each sub-pixel including one transistor 101 as an example. The light emitting structure 103 may include a first electrode 21, a pixel define layer, an organic light emitting layer and a second electrode 26. The first electrode 21 is connected with a drain electrode of a transistor 101 through a via, the organic light emitting layer is connected with the first electrode 21, the second electrode 26 is connected with the organic light emitting layer, and the organic light emitting layer emits light of corresponding color under the drive of the first electrode 21 and the second electrode 26. The encapsulation layer 104 may include a first encapsulation layer 401, a second encapsulation layer 402, and a third encapsulation layer 403 which are stacked, wherein the first encapsulation layer 401 and the third encapsulation layer 403 may be made of an inorganic material, the second encapsulation layer 402 may be made of an organic material, and the second encapsulation layer 402 is disposed between the first encapsulation layer 401 and the third encapsulation layer 403, thus ensuring that external water vapor cannot enter the light emitting structure layer 103.

In an exemplary embodiment, as shown in FIG. 2, the pixel define layer includes a plurality of first retaining walls 22a and a plurality of second retaining walls 22b, wherein a height of the first retaining wall 22a is less than a height of the second retaining wall 22b; the first retaining wall 22a and the second retaining wall 22b intersect to define a plurality of pixel opening regions; the pixel opening region includes a first pixel opening region 221 and a second pixel opening region 222; the area of the first pixel opening region 221 is larger than the area of the second pixel opening region 222; and adjacent first pixel opening region 221 and second pixel opening region 222 are separated by a first retaining wall 22a.

In an exemplary embodiment, as shown in FIG. 2, first retaining walls 22a extend along a first direction D1, a plurality of first retaining walls 22a are disposed in turn along a second direction D2, second retaining walls 22b extend along the second direction D2, and a plurality of second retaining walls 22b are disposed in turn along the first direction D1, there are a plurality of first retaining walls 22a disposed in turn along the second direction D2 between two adjacent second retaining walls 22*b*, wherein the first direction D1 intersects the second direction D2.

A second retaining wall 22*b* includes a first sub-retaining wall 22*b*1 and a second sub-retaining wall 22*b*2 disposed at intervals. The first sub-retaining wall 22*b*1 has a plurality of first bending parts 22*b*1*a* and a plurality of second extending parts 22*b*1*b* which are alternately disposed. The first bending parts 22*b*1*a* extend in the first direction D1, the second extending parts 22*b*1*b* extend in the second direction D2, and the second sub-retaining wall 22*b*2 extends in the second direction D2.

In an exemplary embodiment, a first direction D1 is the same as an extending direction of a gate line, and a second direction D2 is the same as an extending direction of a data line. Exemplarily, a first direction and a second direction may be perpendicular to each other.

In an exemplary embodiment, as shown in FIG. 2, the first pixel opening regions 221 and the second pixel opening regions 222 are alternately disposed along the second direction D2, each sub-pixel in a same column has the same color, and adjacent sub-pixels in the same column are separated by the first retaining wall 22*a*.

In an exemplary embodiment, as shown in FIG. 2, the first pixel opening regions 221 and the second pixel opening regions 222 are alternately disposed along the first direction D1, the colors of adjacent sub-pixels in a same row of sub-pixels are different, and are separated by a second retaining wall 22*b*.

In an exemplary embodiment, as shown in FIG. 2, two adjacent first bending parts 22*b*1*a* of the same first sub-retaining wall 22*b*1, a second extending part 22*b*1*b* between two adjacent first bending parts 22*b*1*a*, a second sub-retaining wall 22*b*2 adjacent to the first sub-retaining wall 22*b*1 and a first retaining wall 22*a* between the first sub-retaining wall 22*b*1 and the second sub-retaining wall 22*b*2 enclose a first pixel opening region 221; and a second extending part 22*b*1*b* between the two adjacent first bending parts 22*b*1*a* of the same first sub-retaining wall 22*b*1, a second sub-retaining wall 22*b*2 adjacent to the first sub-retaining wall 22*b*1 and a first retaining wall 22*a* between the first sub-retaining wall 22*b*1 and the second sub-retaining wall 22*b*2 enclose a second pixel opening region 222.

In an exemplary embodiment, as shown in FIG. 2, the bending times and bending directions of the plurality of first bending parts 22*b*1*a* of the plurality of first sub-retaining wall 22*b*1 are the same.

In an exemplary embodiment, as shown in FIG. 2, a width of the first retaining wall 22*a* is less than a width of the second retaining wall 22*b*.

In this embodiment, because the first retaining wall 22*a* only needs to separate first electrodes 21 in adjacent sub-pixels, does not need to separate the organic light emitting layers, the first retaining wall 22*a* can be thereby designed as narrow as possible. The second retaining wall 22*b* needs to separate the organic light emitting layers of adjacent sub-pixels, so the width of the second retaining wall 22*b* can be larger the width of the first retaining wall 22*a*.

In an exemplary embodiment, a first retaining wall 22*a* is made of a lyophilic material and a second retaining wall 22*b* is made of a lyophobic material.

In an exemplary embodiment, as shown in FIGS. 3 and 4, a width of a first electrode 21 exposed by a first pixel opening region 221 is greater than or equal to a width of the first electrode 21 exposed by a second pixel opening region 222.

In this embodiment, as shown in FIG. 3, when the width of the first electrode 21 exposed by the first pixel opening region 221 is equal to the width of the first electrode 21 exposed by the second pixel opening region 222, the width of the emitting regions of a plurality of sub-pixels in each pixel unit is the same. At this time, the first pixel opening region 221 is divided into emitting regions and non-emitting regions, the first electrode 21 and the corresponding transistor 101 connected with the first electrode are only provided underneath the emitting region, while the first electrode or the transistor connected with the first electrode is not disposed underneath the non-emitting region. This solution can keep the three sub-pixels in the same size, which makes the display edge smoother.

As shown in FIG. 4, when the width of the first electrode 21 exposed by the first pixel opening region 221 is greater than the width of the first electrode 21 exposed by the second pixel opening region 222, the width of the emitting region of the sub-pixels in the first pixel opening region 221 in each pixel unit is greater than the width of the emitting region of the sub-pixels in the second pixel opening region 222.

Figure 6:
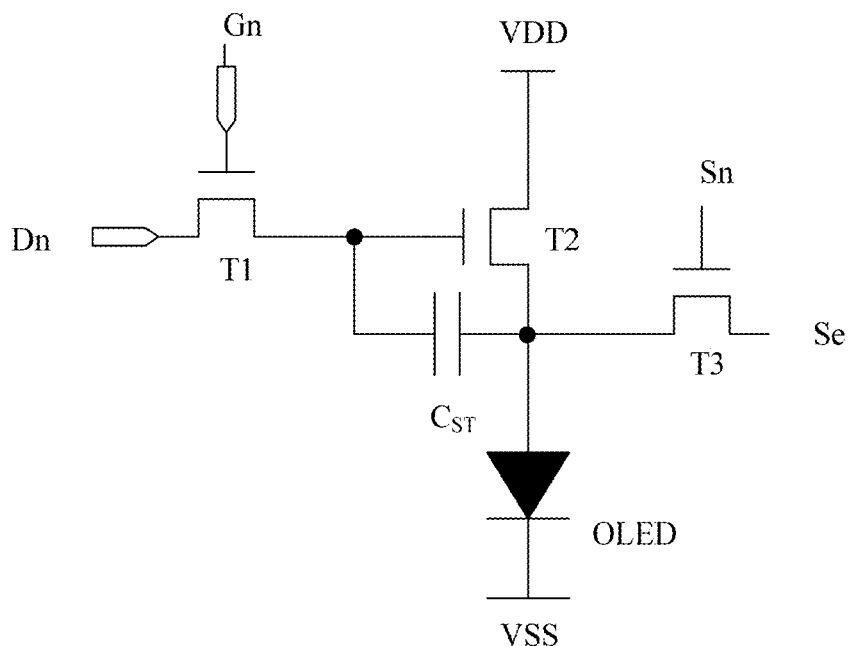
FIG. 6 is a schematic diagram of an equivalent circuit of a pixel drive circuit.

In an exemplary implementation, the pixel drive circuit may have a structure of 3T1C, 4T1C, 5T1C, 5T2C, 6T1C or 7T1C. FIG. 6 illustrates a schematic diagram of an equivalent circuit of a pixel drive circuit. As shown in FIG. 6, the pixel drive circuit has a 3T1C structure, which may include three switching transistors (a first transistor T1, a second transistor T2, and a third transistor T3), one storage capacitor CST, and six signal lines (a data line Dn, a first scan line Gn, a second scan line Sn, a compensation line Se, a first power supply line VDD, and a second power supply line VSS). In an exemplary embodiment, the first transistor T1 is a switching transistor, the second transistor T2 is a drive transistor, and the third transistor T3 is a compensation transistor. A gate electrode of the first transistor T1 is coupled to the first scan line Gn, a first electrode of the first transistor T1 is coupled to the data line Dn, a second electrode of the first transistor T1 is coupled to a gate electrode of the second transistor T2. The first transistor T1 is configured to receive a data signal transmitted by the data line Dn under the control of the first scan line Gn, so that the gate electrode of the second transistor T2 receives the data signal. The gate electrode of the second transistor T2 is coupled to the second electrode of the first transistor T1, a first electrode of the second transistor T2 is coupled to the first power supply line VDD, a second electrode of the second transistor T2 is coupled to a first electrode of an OLED, and the second transistor T2 is configured to generate a corresponding current at the second electrode under the control of the data signal received by the gate electrode of the second transistor. A gate electrode of the third transistor T3 is coupled to the second scan line Sn, a first electrode of the third transistor T3 is connected to the compensation line Se, a second electrode of the third transistor T3 is coupled to the second electrode of the second transistor T2. The third transistor T3 is configured to extract a threshold voltage Vth and the mobility of the second transistor T2 in response to compensation timing to compensate the threshold voltage Vth. The first electrode of the OLED is coupled to the second electrode of the second transistor T2, a second electrode of the OLED is coupled to the second power supply line VSS, and the OLED is configured to emit light with corresponding brightness in response to the current of the second electrode of the second transistor T2. A first electrode of the storage capacitor CST is coupled to the gate electrode of the second transistor T2, a second electrode of the storage capacitor CST is coupled to the second electrode of the second transistor T2, and the storage capacitor CST is configured to store a potential of the gate electrode of the second transistor T2.

In an exemplary embodiment, a signal of the first power supply line VDD is a high-level signal continuously provided, and a signal of the second power supply line VSS is a low-level signal. The first transistor T1 to the third transistor T3 may be P-type transistors or may be N-type transistors. Using the same type of transistors in the pixel drive circuit can simplify the process flow, reduce the process difficulty of the display panel, and improve the yield of the product. In some possible implementations, the first transistor T1 to the third transistor T3 may include a P-type transistor and an N-type transistor. In an exemplary embodiment, the light emitting device may be an Organic Light Emitting Diode (OLED), including a first electrode (anode) 21, an organic light emitting layer, and a second electrode (cathode) 26 which are stacked.

The process of preparing the display substrate will be exemplarily described below. "Patterning process" mentioned in the present disclosure includes photoresist coating, mask exposure, development, etching, photoresist stripping and so on for metal materials, inorganic materials or transparent conducting materials, and includes organic material coating, mask exposure, development and so on for organic materials. Deposition may be implemented by adopting any one or more of sputtering, evaporation and chemical vapor deposition. Coating may be implemented by adopting any one or more of spray coating, spin coating and inkjet printing, and etching may be implemented by adopting any one or more of dry etching and wet etching, which are not limited in the present disclosure. "Thin film" refers to a layer of thin film formed by a certain material on a substrate through deposition, coating or other processes. If a "thin film" does not need a patterning process in the whole preparing process, the "thin film" may also be called a "layer". If a "thin film" needs a patterning process in the whole preparing process, it is called "thin film" before the patterning process and "layer" after the patterning process. A "layer" obtained after a patterning process includes at least one "pattern". "A and B are disposed in the same layer" in the present disclosure means that A and B are formed at the same time through the same patterning process, and the "thickness" of the film layer is the size of the film layer in a direction perpendicular to the display substrate. In an exemplary embodiment of the present disclosure, "an orthographic projection of B is within the range of an orthographic projection of A" refers to the boundary of the orthographic projection of B falling within the boundary range of the orthographic projection of A, or the boundary of the orthographic projection of A overlaps with the boundary of the orthographic projection of B.

In an exemplary embodiment, a process of manufacturing a display substrate may include the following operations.

Figure 7:
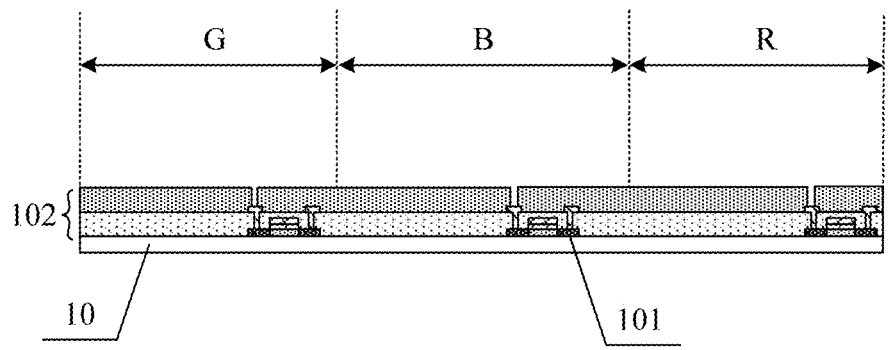
FIG. 7 is a schematic diagram after a drive circuit layer pattern is formed according to an exemplary embodiment of the present disclosure.

(1) First, a pattern of a drive circuit layer 102 is formed on the substrate 10, as illustrated in FIG. 7. The drive circuit layer 102 includes a plurality of gate lines and a plurality of data lines. The plurality of gate lines and the plurality of data lines intersect to define a plurality of pixel units arranged in a matrix. Each pixel unit includes at least 3 sub-pixels, and each sub-pixel includes a Thin Film Transistor (TFT). In this embodiment, a pixel unit may include three sub-pixels, namely red sub-pixel R, green sub-pixel G and blue sub-pixel B. Of course, the scheme of this embodiment is alternatively applicable to the case where one pixel unit includes four sub-pixels (red sub-pixel R, green sub-pixel G, blue sub-pixel B and white sub-pixel W).

In an exemplary embodiment, the substrate 10 may be a flexible substrate or may be a rigid substrate. In an exemplary embodiment, the flexible substrate may include a first flexible material layer, a first inorganic material layer, a semiconductor layer, a second flexible material layer, and a second inorganic material layer which are stacked. Materials of the first and second flexible material layer may be polyimide (PI), polyethylene terephthalate (PET), or a polymer soft film subjected to surface treatment, etc. Materials of the first and second inorganic material layers may be silicon nitride (SiNx), silicon oxide (SiOx), or the like, so as to improve water-oxygen resistance capability of the substrate. The first and second inorganic material layers are also referred to as barrier layers. A material of the semiconductor layer may be amorphous silicon (a-si). In an exemplary embodiment, taking a stacked structure as an example, a manufacturing process thereof may include: first, a layer of polyimide is coated on a glass carrier plate, and a first flexible (PI1) layer is formed after curing for film formation; a layer of barrier thin film is deposited on the first flexible layer to form a first barrier (Barrier 1) layer covering the first flexible layer; a layer of amorphous silicon thin film is deposited on the first barrier layer to form an amorphous silicon (a-si) layer covering the first barrier layer; a layer of polyimide is coated on the amorphous silicon layer, and a second flexible (PI2) layer is formed after curing for film formation; and then a layer of barrier thin film is deposited on the second flexible layer to form a second barrier (Barrier 2) layer covering the second flexible layer, till which the manufacturing of the substrate 10 is completed.

In an exemplary embodiment, a process of manufacturing a drive circuit layer 102 may include: a shield thin film is deposited on the substrate 10, and the shield thin film is patterned through a patterning process to form a pattern of a shield layer on the substrate 10.

Then, a first insulating thin film and a semiconductor thin film are deposited sequentially, and the semiconductor thin film is patterned through a patterning process to form a first insulating layer covering the pattern of the barrier layer and a pattern of a semiconductor layer disposed on the first insulating layer. The pattern of the semiconductor layer at least includes an active layer, wherein an orthographic projection of the active layer on the substrate 10 is within the range of an orthographic projection of the shield layer on the substrate 10.

Then, a second insulating thin film and a first metal thin film are deposited sequentially, the first metal thin film is patterned through a patterning process to form a second insulating layer disposed on the pattern of the semiconductor layer and form a pattern of a first metal layer disposed on the second insulating layer. The pattern of the first metal layer at least includes a gate electrode, wherein an orthographic projection of the second insulating layer on the substrate 10 is within the range of the orthographic projection of the active layer on the substrate 10, and an orthographic projection of the gate electrode on the substrate 10 is within the range of the orthographic projection of the second insulating layer on the substrate 10.

Then, a third insulating thin film is deposited, and the third insulating thin film is patterned through a patterning process to form a third insulating layer covering the pattern of the first metal layer, wherein the third insulating layer is provided with a pattern of active via holes. Two active via holes are located at the positions of two ends of the active layer, and the third insulating layer in the active via holes is etched to expose a surface of the active layer.

Then, a second metal thin film is deposited, and the second metal thin film is patterned through a patterning process to form a pattern of a second metal layer on the third insulating layer, wherein the pattern of the second metal layer at least includes a source electrode and a drain electrode, wherein the source electrode and the drain electrode are respectively connected to the active layer through the active via holes.

Then, a planarization film is coated, the planarization film is patterned through a patterning process to form a planarization layer covering the pattern of the second metal layer, wherein the planarization layer is provided with a pattern of an anode via hole, and the planarization layer in the anode via hole is etched away to expose the surface of the drain electrode.

So far, the pattern of the drive circuit layer 102 is formed on the substrate 10, as illustrated in FIG. 7. In an exemplary embodiment, an active layer, a gate electrode, a source electrode and a drain electrode together form a transistor 101. In an exemplary embodiment, a first transistor 101 may be a drive transistor in a pixel drive circuit, and the drive transistor may be a Thin Film Transistor (TFT).

In an exemplary embodiment, a first insulating layer, a second insulating layer and a third insulating layer may be made of any one or more of silicon oxide (SiOx), silicon nitride (SiNx) and silicon oxynitride (SiON), and may be a single layer, a plurality of layers or a composite layer. The first insulating layer is referred to as a Buffer layer, the second insulating layer is referred to as a Gate Insulating (GI) layer, the third insulating layer is referred to as an Interlayer Dielectric (ILD) layer. The planarization thin film may be made of an organic material such as resin. The first metal thin film and the second metal thin film may be made of a metal material, such as any one or more of silver (Ag), copper (Cu), aluminum (Al), titanium (Ti), and molybdenum (Mo), or an alloy material of the above metals, such as aluminum neodymium alloy (AlNd) or molybdenum niobium alloy (MoNb), and may be in a single-layer structure or multi-layer composite structure, such as Ti/Al/Ti. The shield thin film may be made of a metal material, or a non-metal material which is opaque to light. The active layer thin film may be made of an amorphous indium gallium zinc oxide (a-IGZO), zinc oxynitride (ZnON), indium zinc tin oxide (IZTO), amorphous silicon (a-Si), polycrystalline silicon (p-Si), hexathiophene, polythiophene and other materials, that is, the present disclosure is applicable to transistors manufactured based on oxide technology, silicon technology and organic matter technology.

(2) A pattern of the first electrode 21 is formed on the substrate on which the aforementioned patterns are formed. In an exemplary embodiment, the forming a pattern of a first electrode may include: a first transparent conductive film is deposited on the substrate on which the aforementioned patterns are formed, and the first transparent conductive film is patterned through a patterning process to form a pattern of a first electrode 21, and the first electrode 21 of each sub-pixel is connected with a drain electrode of a thin film transistor in the sub-pixel, as illustrated in FIG. 8 to 9 or 10 to 11.

Figure 8:
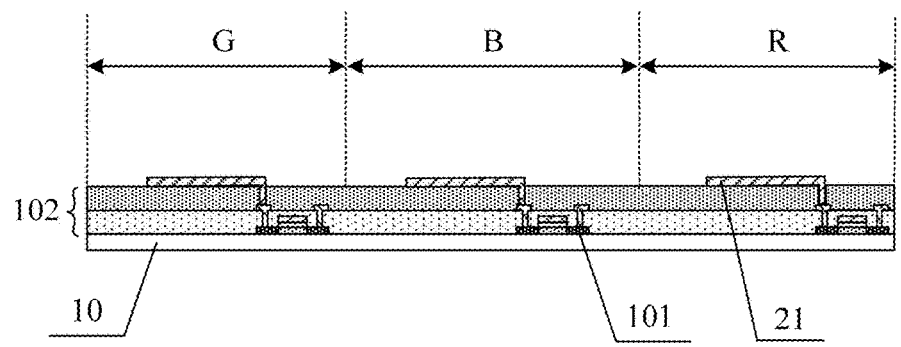
FIG. 8 is a schematic diagram after a first electrode pattern is formed according to an exemplary embodiment of the present disclosure.
Figure 9:
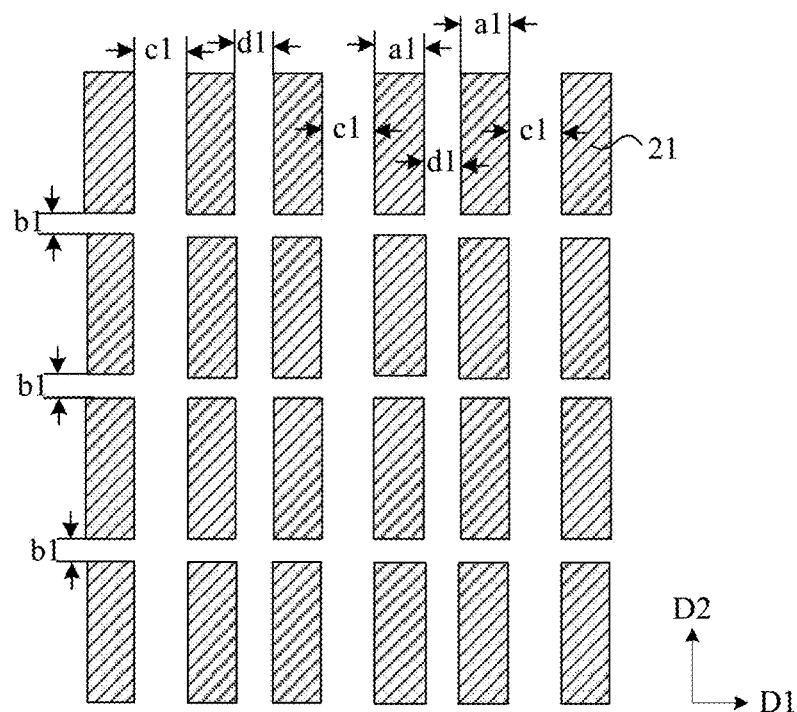
FIG. 9 is a schematic plan view of the first electrode pattern shown in FIG. 8.

In an exemplary embodiment, as shown in FIGS. 8 to 9, the widths a1 of first electrodes 21 of all sub-pixels along a first direction D1 are the same, the first electrodes 21 of all sub-pixels are disposed in a matrix along the first direction D1 and a second direction D2, the distances b1 between the first electrodes 21 of adjacent rows are equal, and a distance c1 between a first electrode 21 in a (2n+1)-th column and a first electrode 21 in a (2n+2)-th column is larger than a distance d1 between a first electrode 21 in a (2n+2)-th column and a first electrode 21 in a (2n+3)-th column, where n is an integer greater than or equal to zero.

In an exemplary embodiment, a first transparent conductive film may be made of indium tin oxide (ITO) or indium zinc oxide (IZO), etc.

Figure 10:
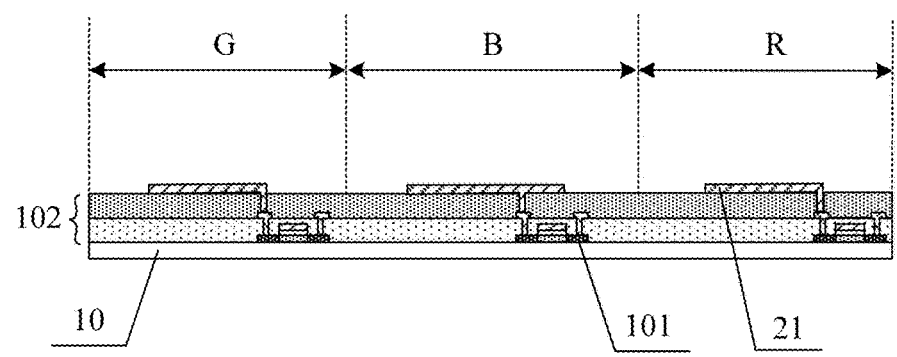
FIG. 10 is another schematic diagram after a first electrode pattern is formed according to an exemplary embodiment of the present disclosure.
Figure 11:
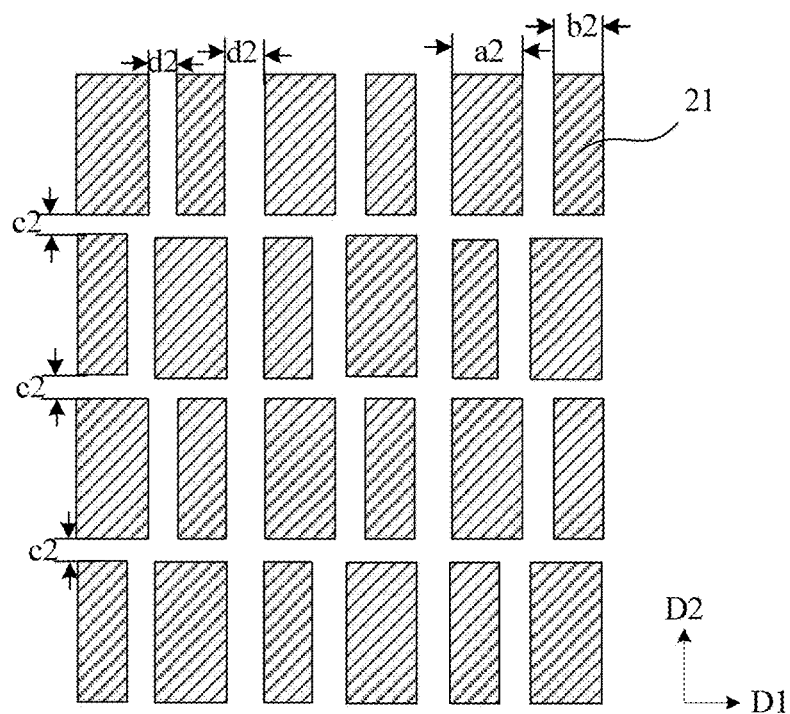
FIG. 11 is a schematic plan view of the first electrode pattern shown in FIG. 10.
Figure 12:
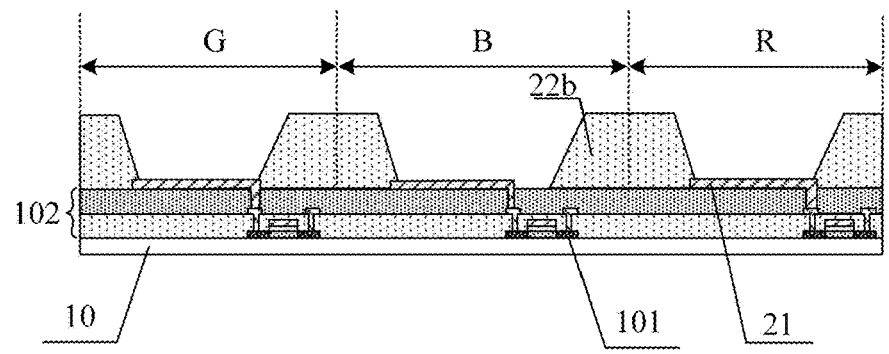
FIG. 12 is a schematic diagram after a pixel define layer pattern is formed according to an exemplary embodiment of the present disclosure.
Figure 13:
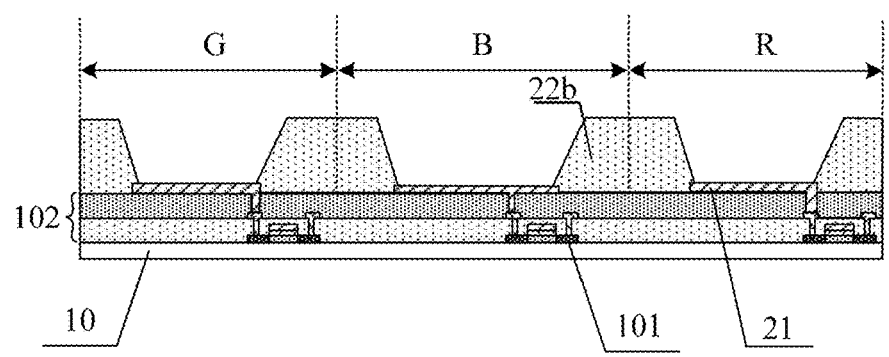
FIG. 13 is another schematic diagram after forming a pixel define layer pattern according to an exemplary embodiment of the present disclosure.

In an exemplary embodiment, as shown in FIGS. 10 to 11, the widths of the first electrodes 21 of adjacent sub-pixels along the first direction D1 are different. Among the first electrodes 21 of every two adjacent sub-pixels, a width of one electrode 21 along the first direction D1 is a2, and a width of the other electrode 21 along the first direction D1 is b2, a2>b2. The first electrodes 21 of all sub-pixels are arranged in a matrix along the first direction D1 and the second direction D2, a distance c2 between two first electrodes 21 in adjacent rows is equal, and a distance between two first electrodes 21 in adjacent columns d2 is equal.

In an exemplary embodiment, a first electrode 21 may be made of metals with high reflectivity, such as silver Ag, gold Au, palladium Pd, platinum Pt, etc., or alloys of these metals, or composite layers of these metals, or a composite layer structure of indium tin oxide ITO layer and metal reflective layer, which has good conductivity, high reflectivity and good morphological stability.

(3) A pixel define layer pattern is formed on the substrate on which the aforementioned patterns are formed. The pixel define layer is used to define an emitting region exposing the first electrode 21 in each sub-pixel, as shown in FIGS. 12 to 16.

In an exemplary embodiment, forming a pattern of a pixel define layer includes: a pixel define film is coated on the substrate on which the aforementioned patterns are formed, and the pixel define film is exposed and developed once using a halftone mask to form a pattern of a pixel define layer that includes both a first retaining wall 22a and a second retaining wall 22b.

In another exemplary embodiment, forming a pattern of a pixel define layer includes: a first pixel define film is coated on the substrate on which the aforementioned patterns are formed, the first pixel define film is exposed and developed with a monochromatic mask to form a pattern of a first retaining wall 22a; a second pixel define film is coated on the substrate on which the aforementioned patterns are formed, the second pixel define film is exposed and developed with a monochromatic mask to form a pattern of a second retaining wall 22b.

In an exemplary embodiment, a pixel define layer includes a plurality of first retaining walls 22a extending along a first direction D1 and a plurality of second retaining walls 22b extending along a second direction D2, wherein the first direction D1 intersects the second direction D2. The first retaining walls 22a and the second retaining walls 22b intersect to define a plurality of pixel opening regions, which include first pixel opening regions 221 and second pixel opening regions 222. The first pixel opening regions 221 and second pixel opening regions 222 are alternately disposed along the second direction D2, and the area of the first pixel opening region 221 is larger than the area of the second pixel opening region 222.

In an exemplary embodiment, a second retaining wall 22b includes a first sub-retaining wall 22b1 and a second sub-retaining wall 22b2 disposed at intervals. The first sub-retaining wall 22b1 has a plurality of first bending parts 22b1a and a plurality of second extending parts 22b1b which are alternately disposed. The first bending parts 22b1a extend in the first direction D1, the second extending parts 22b1b extend in the second direction D2.

In an exemplary embodiment, two adjacent first bending parts 22b1a of the same first sub-retaining wall 22b1, a second extending part 22b1b between two adjacent first bending parts 22b1a, a second sub-retaining wall 22b2 adjacent to the first sub-retaining wall 22b1 and a first retaining wall 22a between the first sub-retaining wall 22b1 and the second sub-retaining wall 22b2 enclose a first pixel opening region 221; and a second extending part 22b1b between the two adjacent first bending parts 22b1a of the same first sub-retaining wall 22b1, a second sub-retaining wall 22b2 adjacent to the first sub-retaining wall 22b1 and a first retaining wall 22a between the first sub-retaining wall 22b1 and the second sub-retaining wall 22b2 enclose a second pixel opening region 222.

In an exemplary embodiment, a width a3 of the second retaining wall 22b along the first direction D1 is between ⅓ and ⅔ of a width b3 of the first bending part 22b1a along the first direction D1.

In an exemplary embodiment, a width d3 of the second pixel opening region 222 along the first direction D1 is between ⅓ and ⅔ of a width d4 of the first pixel opening region 221 along the first direction D1.

In an exemplary embodiment, a height of a first retaining wall 22a is less than a height of a second retaining wall 22b.

In an exemplary embodiment, a height of a first retaining wall 22a is less than 1 micron. In an exemplary embodiment, a height of a second retaining wall 22b is 1.2 microns to 1.5 microns.

In this embodiment, because the ink only prints into the first pixel opening region 221 and the ink in the second pixel opening region 222 is flowed from the first pixel opening region 221 when the organic light emitting layer is printed, the first retaining wall 22a does not need to consider the overflow of ink, but only needs to isolate the first electrodes 21 of adjacent sub-pixels, and the width c3 of the first retaining wall 22a along the second direction D2 may be designed as narrow as possible, thus improving the pixel resolution. In an exemplary embodiment, a first retaining wall 22a only needs to cover the edges of two adjacent first electrodes 21, for example, it may cover the range of the edges of the first electrodes extending inward less than 3 microns, or even less than 2 microns. In an exemplary embodiment, a second retaining wall 22b covers the edges of two adjacent first electrodes 21, for example, it may cover the range of the edges of the first electrodes extending inward less than 4 microns, or even less than 3 microns, or even less than 2 microns. In an exemplary embodiment, the size of a second retaining wall 22b covering the edge of a first electrode may be greater than or equal to the size of a first retaining wall 22a covering the edge of the first electrode.

In an exemplary embodiment, a first retaining wall 22a is made of a lyophilic material and a second retaining wall 22b is made of a lyophobic material.

In an exemplary embodiment, the bending times and bending directions of the plurality of first bending parts 22b1a of the plurality of first sub-retaining wall 22b1 are the same.

Figure 14:
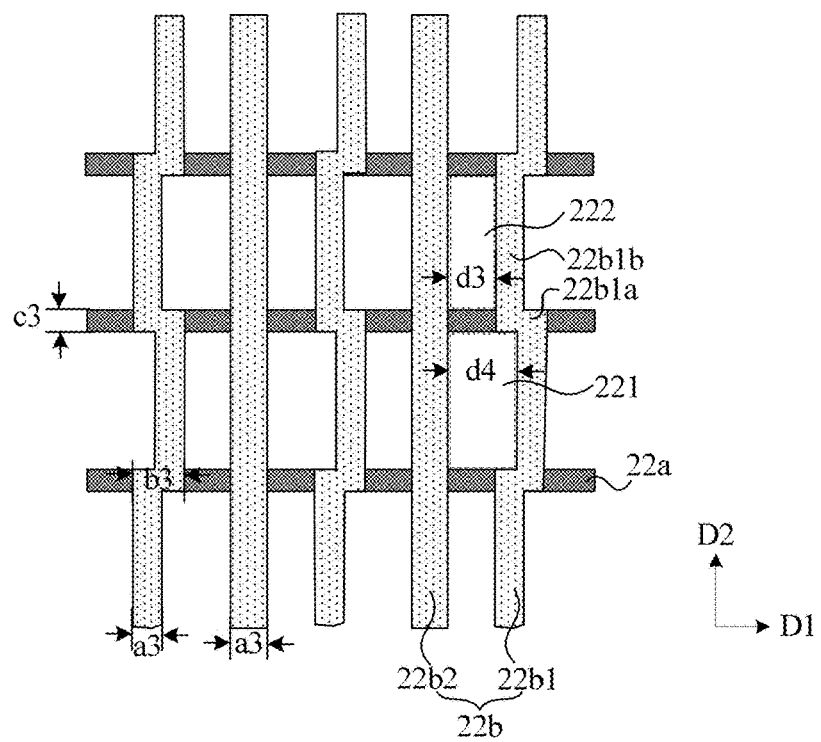
FIG. 14 is a schematic plan view of the pixel define layer pattern shown in FIGS. 12 and 13.
Figure 15:
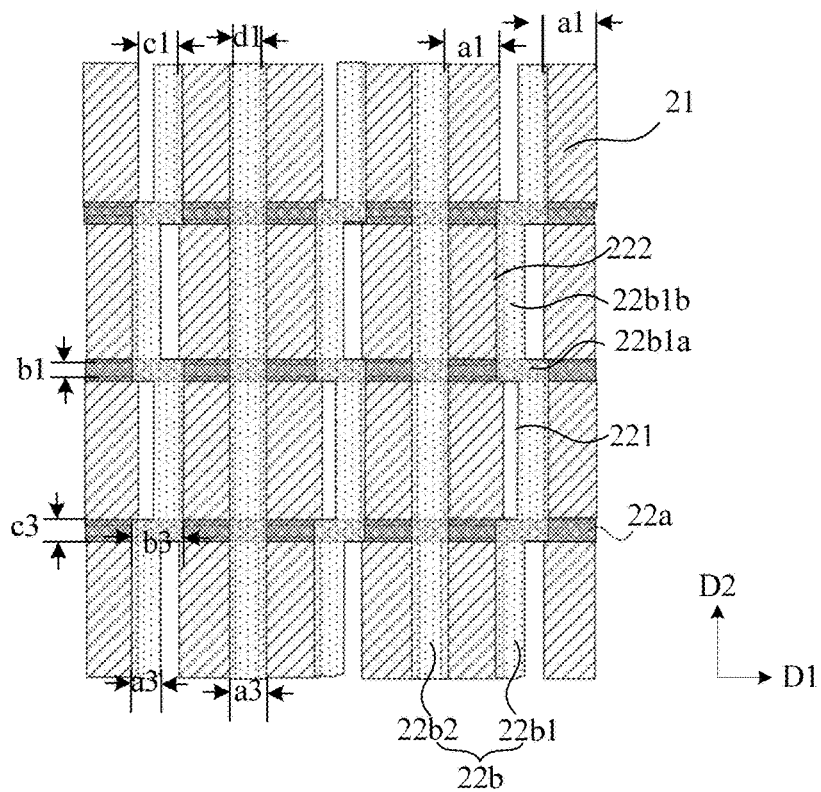
FIGS. 15 and 16 are two schematic plan views of first electrode and pixel define layer patterns formed according to exemplary embodiments of the present disclosure.
Figure 16:
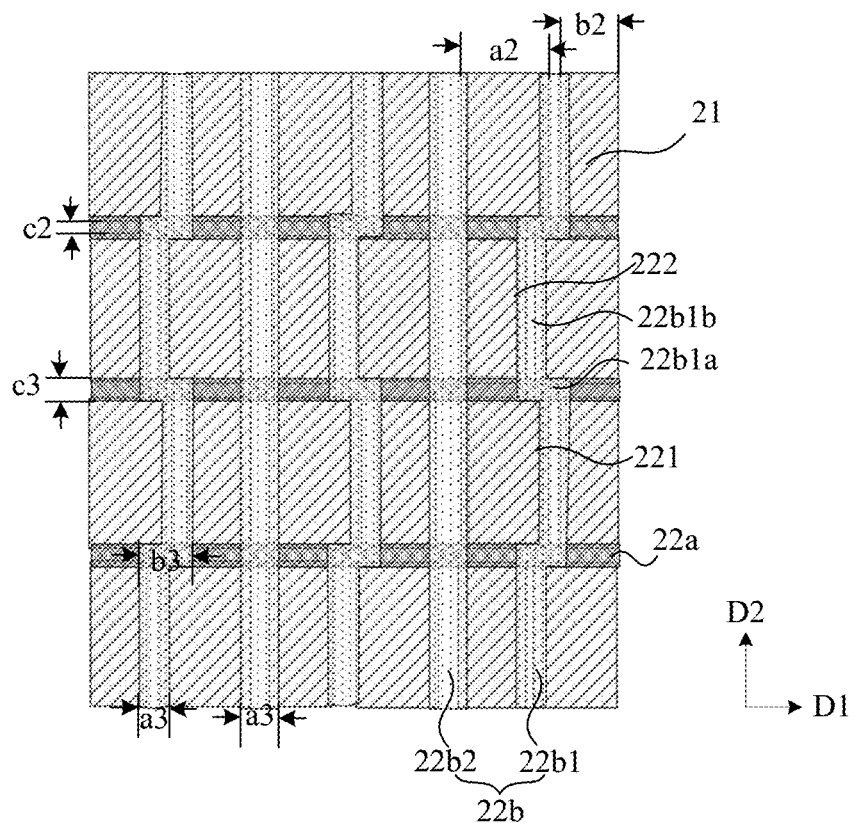

For example, as shown in FIG. 14, when viewed from the top down, a plurality of first bending parts 22b1a of a plurality of first sub-retaining walls 22b1 are all bent in the sequence of bending to the left, to the right, to the left, to the right, etc., that is, the bending times and bending directions of the plurality of first bending parts 22b1a of the plurality of first sub-retaining wall 22b1 are the same. Therefore, the first pixel opening regions 221 and the second pixel opening regions 222 defined by the intersection of the first retaining walls 22a and the second retaining walls 22b are alternately arranged along the first direction D1. Since the ink only prints into the first pixel opening region 221 and the ink in the second pixel opening region 222 is flowed from the first pixel opening region 221 when the organic light emitting layer is printed, the second retaining wall 22b only needs to consider the problem of ink overflow on one side, and a width a3 of the second retaining wall 22b along the first direction D1 may be designed to be narrower. In addition, the first retaining wall 22a only needs to separate the first electrodes 21 in adjacent sub-pixels, does not need to separate the organic light emitting layers. Therefore, a width c3 of the first retaining wall 22a along the second direction D2 may be designed as narrow as possible, thus greatly improving the pixel resolution.

In an exemplary embodiment, a width a3 of the second retaining wall 22b along the first direction D1 is 5 to 30 microns. Illustratively, the width a3 of the second retaining wall 22b along the first direction D1 is 5 to 10 microns.

In an exemplary embodiment, in a plane parallel to the display substrate, a first pixel opening region 221 and a second pixel opening region 222 may be in the shape of a triangle, a rectangle, a polygon, a circle, an ellipse, or the like. In a plane perpendicular to the display substrate, the sectional shapes of the first pixel opening region 221 and the second pixel opening region 222 may be a rectangle or a trapezoid.

Figure 17:
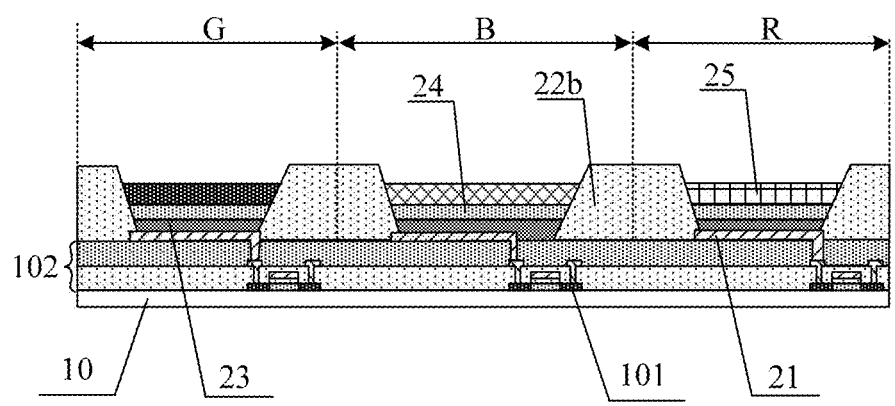
FIG. 17 is a schematic diagram after an organic light emitting layer pattern is formed according to an exemplary embodiment of the present disclosure.
Figure 18:
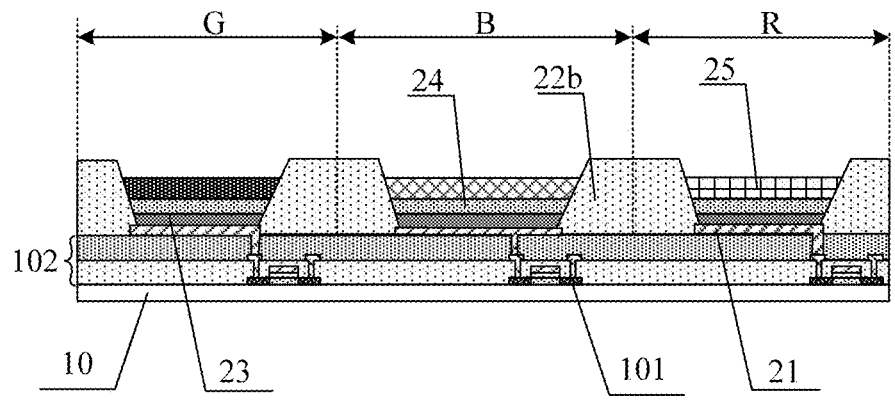
FIG. 18 is another schematic diagram after an organic light emitting layer pattern is formed according to an exemplary embodiment of the present disclosure.

(4) A pattern of an organic light emitting layer is formed on the substrate on which the aforementioned patterns are formed. In an exemplary embodiment, forming a pattern of an organic light emitting layer may include: hole injection material ink is inkjet printed on the first pixel opening region 221; because the first retaining wall 22a is made of lyophilic material and has a low height, the hole injection material ink is flowed to the second pixel opening region 222 adjacent to the first pixel opening region 221, the solvent of the hole injection material ink is removed by drying, and a pattern of a hole injection layer 23 is formed by baking;

hole transport material ink is inkjet printed on the first pixel opening region 221; because the first retaining wall 22a is made of lyophilic material and has a low height, the hole transport material ink is flowed to the second pixel opening region 222 adjacent to the first pixel opening region 221, the solvent of the hole transport material ink is removed by drying, and a pattern of a hole transport layer 24 is formed by baking; and luminescent material ink is inkjet printed on the first pixel opening region 221; because the first retaining wall 22a is made of lyophilic material and has a low height, the luminescent material ink is flowed to the second pixel opening region 222 adjacent to the first pixel opening region 221, the solvent of the luminescent material ink is removed by drying, and a pattern of an emitting layer 25 is formed by baking, as shown in FIGS. 17 to 18.

In an exemplary embodiment, in addition to the aforementioned Hole Injection Layer (HIL) 23, Hole Transport Layer (HTL) 24, and Emitting Layer (EML) 25, the organic light emitting layer may further include any one or more of the following: an Electron Block Layer (EBL), a Hole Block Layer (HBL), an Electron Transport Layer (ETL) and an Electron Injection Layer (EIL). In an exemplary embodiment, an electron block layer, a hole block layer, an electron transport layer and an electron injection layer may be formed by Open Mask evaporation.

In an exemplary embodiment, the electron block layer may be used as a micro-cavity regulating layer of an emitting device. By designing the thickness of the electron block layer, the thickness of the organic light emitting layer between the cathode and the anode can satisfy the design for the length of a micro-cavity. In some exemplary implementation modes, the hole transport layer, hole block layer, or electron transport layer in the organic light emitting layer may be adopted as the micro-cavity adjustment layer of the light emitting device. No limits are made in the present disclosure.

In an exemplary embodiment, the emitting layer may include a host material and a dopant material doped into the host material. The doping ratio of the dopant material in the emitting layer is 1% to 20%. Within the doping ratio range, on the one hand, the host material in the emitting layer can effectively transfer the exciton energy to the dopant material in the emitting layer to excite the emitting layer to emit light; on the other hand, the host material in the emitting layer "dilutes" the dopant material in the emitting layer, which effectively alleviates the fluorescence quenching caused by the collision between molecules and energy of the dopant material in the emitting layer, The luminous efficiency and device life are improved. In an exemplary embodiment, the doping ratio refers to the ratio of the mass of the dopant material to the mass of the emitting layer, that is, the mass percentage. In an exemplary embodiment, the thickness of the emitting layer may be about 10 nm to 50 nm.

In an exemplary embodiment, the hole injection layer may be made of an inorganic oxide, such as molybdenum oxide, titanium oxide, vanadium oxide, rhenium oxide, ruthenium oxide, chromium oxide, zirconium oxide, hafnium oxide, tantalum oxide, silver oxide, tungsten oxide or manganese oxide, or may be made of a p-type dopant of an electron absorption system and a dopant of a hole transport material. In an exemplary embodiment, a thickness of the hole injection layer may be about 5 nm to 20 nm.

In an exemplary embodiment, the hole transport layer may be made of a material with high hole mobility, such as an aromatic amine compound, and its substituent group may be carbazole, methylfluorene, spirofluorene, dibenzothiophene or furan. In an exemplary embodiment, the thickness of the hole transport layer may be about 40 nm to 150 nm.

In an exemplary embodiment, the hole block layer and the electron transport layer may use aromatic heterocyclic compounds, such as imidazole derivatives like benzimidazole derivatives, imidazopyridine derivatives, and benzimidazophenanthridine derivatives; oxazine derivatives like pyrimidine derivatives and triazine derivatives; compounds having a nitrogen-containing six-membered ring structure (also including compounds having a phosphine oxide-based substituent on the heterocyclic ring) such as quinoline derivatives, isoquinoline derivatives, phenanthroline derivatives, etc. In an exemplary embodiment, a thickness of the hole block layer may be about 5 nm to 15 nm, and a thickness of the electron transport layer may be about 20 nm to 50 nm.

In an exemplary embodiment, the electron injection layer may use alkali metals or metals such as lithium fluoride (LiF), ytterbium (Yb), magnesium (Mg) or Calcium (ca), or compounds of these alkali metals or metals. In an exemplary embodiment, a thickness of the electron injection layer may be about 0.5 nm to 2 nm.

Figure 19:
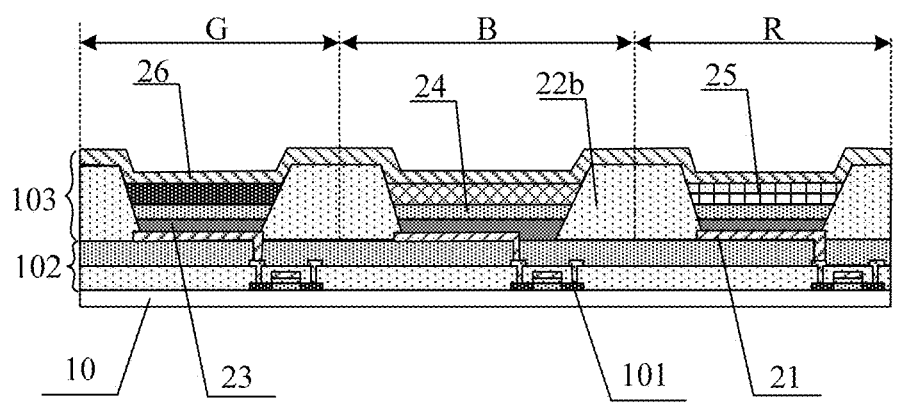
FIG. 19 is a schematic diagram after a second electrode pattern is formed according to an exemplary embodiment of the present disclosure.
Figure 20:
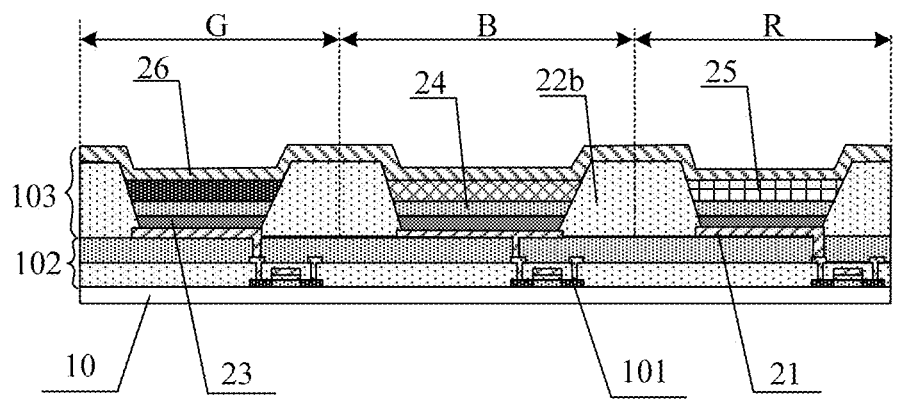
FIG. 20 is another schematic diagram after a second electrode pattern is formed according to an exemplary embodiment of the present disclosure.

(5) A pattern of a second electrode 26 is formed on the substrate on which the aforementioned patterns are formed. In an exemplary embodiment, forming a pattern of a second electrode 26 may include: a second electrode material is vapor-deposited on the substrate on which the aforementioned patterns are formed to form a pattern of a second electrode 26, and the second electrode 26 is connected to the emitting layer 25, as shown in FIGS. 19-20. In an exemplary embodiment, second electrodes 26 may form a communicated integral structure.

So far, the pattern of the light emitting structure layer 103 is formed on the drive circuit layer 102. The light emitting structure layer 103 includes a first electrode 21, a pixel define layer, an organic light emitting layer and a second electrode 26, wherein the organic light emitting layer is respectively connected to the first electrode 21 and the second electrode 26.

(6) A pattern of an encapsulation layer 104 is formed on the substrate on which the aforementioned patterns are formed, as shown in FIG. 3 or FIG. 4. The forming of a pattern of an encapsulation layer 104 includes: A first inorganic thin film is deposited by Plasma Enhanced Chemical Vapor Deposition (PECVD) through an open mask to form a first encapsulation layer 401. Then, inkjet printing an organic material on the first encapsulation layer 401 through an inkjet printing process, and a second encapsulation layer 402 is formed after curing to a film. Next, a second inorganic thin film is deposited through an open mask to form a third encapsulation layer 403, a first encapsulation layer 401, a second encapsulation layer 402, and a third encapsulation layer 403 together form the encapsulation layer 104. In an exemplary embodiment, a first encapsulation layer 401 and a third encapsulation layer 403 may be made of any one or more of silicon oxide (SiOx), silicon nitride (SiNx), and silicon nitride (SiON), and each may be in a single-layer structure, a multi-layer structure, or a composite layer structure; a second encapsulation layer 402 may be made of a resin material, thereby forming a stacked structure of inorganic material/organic material/inorganic material, wherein the organic material layer is disposed between the two inorganic material layers, thus ensuring that the external water vapor cannot enter the light emitting structure layer 103.

In an exemplary embodiment, after the encapsulation layer 104 is formed, a touch structure layer (TSP) may be formed on the encapsulation layer 104, and the touch structure layer may include a touch electrode layer, or include a touch electrode layer and a touch insulating layer.

In an exemplary embodiment, during the manufacturing for a flexible display substrate, the process of manufacturing the display substrate may include processes such as stripping a glass carrier plate, attaching a back film, and cutting, which is not limited in the present disclosure.

It can be seen from the structure and the manufacturing process of the display substrate according to the exemplary embodiment of the present disclosure that, in a plane perpendicular to the display substrate, by forming two retaining walls with different heights (and lyophilicity) to enclose the first pixel opening regions 221 and the second pixel opening regions 222 which are alternately disposed, and the ink is only printed to the first pixel opening regions 221 when the organic light emitting layer is printed. The ink in a first pixel opening region 221 can flow into a second pixel opening region 222, so that the pixels in the second pixel opening region 222 may be designed to be as narrow as possible. Because the ink in the second pixel opening region 222 is flowed from the first pixel opening region 221, the first retaining wall 22a does not need to consider the overflow problem of the ink on either side, so the first retaining wall 22a may be designed to be as narrow as possible. The second retaining wall 22b only considers the overflow of ink on one side. Therefore, the second retaining wall 22b may also be designed to be narrower, which improves the pixel resolution, solves the defects caused by the errors of the ink ejection amount among a plurality of nozzles, and is beneficial to improving the display quality. The preparation method for a display substrate in the exemplary embodiment of the present disclosure is high in process compatibility, the process is simple and easy to implement, and has high production efficiency, low production cost, making it convenient for mass printing production, and has high yield rate.

The structure and its preparing process in the exemplary embodiment of the present disclosure are only exemplarily described. In an exemplary embodiment, the corresponding structure may be changed and the patterning process may be added or reduced according to the actual needs. For example, the transistor in the drive circuit layer 102 may have a top-gate structure, a bottom-gate structure, a single-gate structure, or a double-gate structure. For another example, the drive circuit layer 102 and the light emitting structure layer 103 may alternatively be provided therein with other film layer structures, electrode structures, or lead structures. For another example, the substrate 10 may be a glass substrate. No specific limits are made in the present disclosure.

The present disclosure further provides a method for preparing a display substrate. In an exemplary embodiment, the method may include: a drive circuit layer including a thin film transistor is formed on a substrate; a light emitting structure layer is formed on the drive circuit layer, and the light emitting structure layer includes a first electrode, a pixel define layer, an organic light emitting layer and a second electrode, wherein the first electrode is connected with a drain electrode of the transistor, and the organic light emitting layer is respectively connected to the first electrode and the second electrode; the pixel define layer includes a plurality of first retaining walls and a plurality of second retaining walls, wherein a height of the first retaining wall is less than a height of the second retaining wall; the first retaining wall and the second retaining wall intersect to define a plurality of pixel opening regions; the pixel opening region includes a first pixel opening region and a second pixel opening region; the area of the first pixel opening region is larger than the area of the second pixel opening region; and at least a pair of adjacent first pixel opening region and second pixel opening region are separated by a first retaining wall.

In an exemplary embodiment, forming the light emitting structure layer on the drive circuit layer includes: a pattern of a first electrode is formed on the drive structure layer; a pattern of a pixel define layer is formed through a halftone mask patterning process; a pattern of an organic light emitting layer is formed through an inkjet printing process, wherein during inkjet printing, the organic light emitting layer material ink is only printed to the first pixel opening region; and a pattern of a second electrode is formed, wherein the second electrode is connected to the organic light emitting layer.

In an exemplary embodiment, forming the light emitting structure layer on the drive circuit layer includes: a pattern of a first electrode is formed on the drive structure layer; a pattern of a first retaining wall in a pixel define layer is formed through a first monochromatic mask patterning process; a pattern of a second retaining wall in the pixel define layer is formed through a second monochromatic mask patterning process; a pattern of an organic light emitting layer is formed through an inkjet printing process, wherein during inkjet printing, the organic light emitting layer material ink is only printed to the first pixel opening region; and a pattern of a second electrode is formed, wherein the second electrode is connected to the organic light emitting layer.

In an exemplary embodiment, forming an organic light emitting layer pattern through an inkjet printing process includes any one or more of the following:
hole injection material ink is inkjet printed on the first pixel opening region, the hole injection material ink is flowed to the second pixel opening region adjacent to the first pixel opening region, the solvent of the hole injection material ink is removed by drying, and a hole injection layer pattern is formed by baking;
hole transport material ink is inkjet printed on the first pixel opening region, the hole transport material ink is flowed to the second pixel opening region adjacent to the first pixel opening region, the solvent of the hole transport material ink is removed by drying, and a hole transport layer pattern is formed by baking; and
luminescent material ink is inkjet printed on the first pixel opening region, the luminescent material ink is flowed to the second pixel opening region adjacent to the first pixel opening region, the solvent of the luminescent material ink is removed by drying, and an emitting layer pattern is formed by baking.

In an exemplary embodiment, the first retaining walls extend along a first direction, a plurality of first retaining walls are disposed in turn along a second direction, and a plurality of second retaining walls are disposed in turn along the first direction, wherein the first direction and the second direction intersect; the second retaining wall includes a first sub-retaining wall and a second sub-retaining wall disposed at intervals, wherein the first sub-retaining wall is provided with a plurality of first bending parts and a plurality of second extending parts which are alternately disposed; the first bending parts extend in the first direction, and the second extending parts extend in the second direction.

In an exemplary embodiment, any two adjacent first bending parts of the same first sub-retaining wall, a second extending part between two adjacent first bending parts, a second sub-retaining wall adjacent to the first sub-retaining wall and a first retaining wall between the first sub-retaining wall and the second sub-retaining wall enclose a first pixel opening region; and a second extending part between any two adjacent first bending parts of the same first sub-retaining wall, a second sub-retaining wall adjacent to the first sub-retaining wall and a first retaining wall between the first sub-retaining wall and the second sub-retaining wall enclose a second pixel opening region.

In an exemplary embodiment, the bending times and bending directions of the plurality of first bending parts of the first sub-retaining wall are the same.

In an exemplary embodiment, a height of the first retaining wall is less than or equal to 1 micron, and a height of the second retaining wall is 1.2 microns to 1.5 microns.

In an exemplary embodiment, a width of the first retaining wall is less than a width of the second retaining wall.

In an exemplary embodiment, the first retaining wall is made of a lyophilic material and the second retaining wall is made of a lyophobic material.

In an exemplary embodiment, a width of a first electrode exposed by the first pixel opening region is greater than or equal to a width of a first electrode exposed by the second pixel opening region.

The present disclosure provides a preparation method for a display substrate. By using two kinds of retaining walls with different heights to enclose a first pixel opening region and a second pixel opening region with different areas, ink is only printed to the first pixel opening region during inkjet printing. Because a first retaining wall has a lower height, the ink in the first pixel opening region can flow into the adjacent second pixel opening region, thus effectively avoiding the problem of low pixel resolution caused by ink overflow, which considerably alleviates the poor process and increases the processing yield. In addition, a distance between adjacent sub-pixel openings can be made smaller to better improve the resolution and display quality.

The present disclosure further provides a display apparatus including the display substrate in the aforementioned embodiments. The display apparatus may be any product or component with a display function, such as a mobile phone, a tablet computer, a television, a display, a laptop computer, a digital photo frame, or a navigator.

Figure 21:
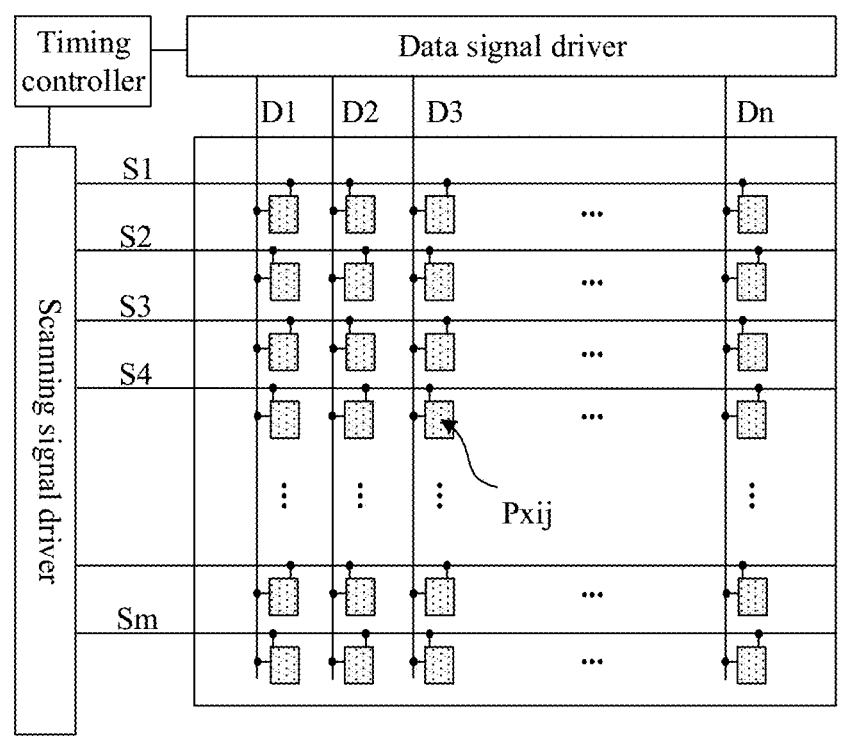
FIG. 21 is a schematic diagram of a structure of a display apparatus according to an exemplary embodiment of the present disclosure.

FIG. 21 is a schematic diagram of a structure of a display apparatus according to an embodiment of the present disclosure. Referring to FIG. 21, an OLED display apparatus may include a timing controller, a data driver, a scan driver, and a pixel array. The pixel array may include a plurality of scanning signal lines (Si to Sm), a plurality of data signal lines (D1 to Dn), and a plurality of sub-pixels Pxij. In an exemplary embodiment, the timing controller may provide gray scale values and a control signal suitable for the specification of the data driver to the data driver, and may provide a clock signal, a scan start signal, and the like suitable for the specification of the scan driver to the scan driver. The data driver may generate data voltages to be provided to data signal lines D1, D2, D3, . . . , and Dn using the gray scale value and the control signal received from the timing controller. For example, the data driver may sample the gray scale values by using the clock signal, and apply the data voltages corresponding to the gray scale values to the data signal lines D1 to Dn in units of sub-pixel rows, wherein n may be a natural number. The scanning driver may generate scanning signals to be provided to scanning signal lines S1, S2, S3, . . . , and Sm by receiving a clock signal, a scanning start signal, and the like from the timing controller. For example, the scan driver may sequentially provide the scanning signals with on-level pulses to the scanning signal lines Si to Sm. For example, the scan driver may be in form of a shift register, and may sequentially transmit the scan starting signal provided in form of the turn-on level pulse to a next-stage circuit to generate the scanning signal under the control of the clock signal. Herein, m may be a natural number. The sub-pixel array may include a plurality of sub-pixels PXij. Each sub-pixel PXij may be connected to a corresponding data signal line and a corresponding scan signal line, wherein i and j may be natural numbers. The sub-pixel PXij may refer to a sub-pixel of which a transistor is connected to an ith scanning signal line and a jth data signal line.

Although the implementations of the present disclosure are disclosed above, the contents are only implementations adopted to easily understand the present disclosure and not intended to limit the present disclosure. Those skilled in the art may make any modifications and variations to implementation forms and details without departing from the spirit and scope disclosed by the present disclosure. However, the scope of patent protection of the present disclosure should also be subject to the scope defined by the appended claims.

The invention claimed is:

1. A display substrate, comprising:
  a substrate, a drive circuit layer disposed on the substrate and a light emitting structure layer disposed on a side of the drive circuit layer away from the substrate, wherein the drive circuit layer comprises a transistor, and the light emitting structure layer comprises a first electrode, a pixel define layer, an organic light emitting layer and a second electrode, wherein the first electrode is connected with a drain electrode of the transistor, and the organic light emitting layer is located between the first electrode and the second electrode;
  the pixel define layer comprises a plurality of first retaining walls and a plurality of second retaining walls, wherein a height of the first retaining walls is less than a height of the second retaining walls; the first retaining walls and the second retaining walls are intersected to define a plurality of pixel opening regions; the pixel opening regions comprise a first pixel opening region and a second pixel opening region; an area of the first pixel opening region is larger than an area of the second pixel opening region; and the first pixel opening region and the second pixel opening region adjacent to each other are separated by a first retaining wall,
  wherein the second retaining wall comprises a first sub-retaining wall and a second sub-retaining wall disposed at intervals, wherein the first sub-retaining wall is provided with a plurality of first bending parts and a plurality of second extending parts which are alternately disposed; the first bending parts extend in a first direction, and the second extending parts extend in a second direction.

2. The display substrate according to claim 1, wherein the second retaining walls extend along the second direction, the plurality of second retaining walls are disposed in sequence along the first direction, and the plurality of first retaining walls are disposed in sequence along the second direction between two adjacent second retaining walls, wherein the first direction and the second direction are intersected.

3. The display substrate according to claim 2, wherein two adjacent first bending parts of a same first sub-retaining wall, a second extending part between two adjacent first bending parts, a second sub-retaining wall adjacent to the first sub-retaining wall and a first retaining wall between the first sub-retaining wall and the second sub-retaining wall enclose one said first pixel opening region; and
  a second extending part between the two adjacent first bending parts of a same first sub-retaining wall, a second sub-retaining wall adjacent to the first sub-retaining wall and a first retaining wall between the first sub-retaining wall and the second sub-retaining wall enclose one said second pixel opening region.

4. The display substrate according to claim 3, further comprising a plurality of light emitting units, each light emitting unit comprising at least three sub-pixels, each sub-pixel comprising the light emitting structure layer disposed on the side of the drive circuit layer away from the substrate, widths of first electrodes of all sub-pixels along the first direction are the same, the first electrodes of all sub-pixels are disposed in a matrix along the first direction and the second direction, distances between the first electrodes of adjacent rows are equal, and a distance between the first electrodes in the (2n+1)-th column and the first electrodes in the (2n+2)-th column is greater than a distance between the first electrodes in the (2n+2)-th column and the first electrodes in the (2n+3)-th column, where n is an integer greater than or equal to 0.

5. The display substrate according to claim 3, further comprising a plurality of light emitting units, each light emitting unit comprising at least three sub-pixels, each sub-pixel comprising the light emitting structure layer disposed on the side of the drive circuit layer away from the substrate, widths of first electrodes of adjacent sub-pixels along the first direction are different, the first electrodes of all sub-pixels are disposed in a matrix along the first direction and the second direction, distances between the first electrodes of adjacent rows are equal, and distances between the first electrodes of adjacent columns are equal.

6. The display substrate according to claim 2, wherein the plurality of first bending parts of the first sub-retaining wall have a same bending length and a same bending direction at each bending.

7. The display substrate according to claim 2, wherein a width of the second retaining walls along the first direction is between ⅓ and ⅔ of a width of the first bending parts along the first direction.

8. The display substrate according to claim 2, wherein a width of the first retaining walls along the second direction is less than a width of the second retaining walls along the first direction.

9. The display substrate according to claim 2, further comprising: a plurality of light emitting units, each of the plurality of light emitting units comprising at least three sub-pixels, and each of the at least three sub-pixels comprising the light emitting structure layer disposed on the side of the drive circuit layer away from the substrate, wherein widths of first electrodes of all sub-pixels along the first direction are the same, the first electrodes of all sub-pixels are disposed in a matrix along the first direction and the second direction, distances between the first electrodes of adjacent rows are equal, and a distance between the first electrodes in the (2n+1)-th column and the first electrodes in the (2n+2)-th column is greater than a distance between the first electrodes in the (2n+1)-th column and the first electrodes in the (2n+3)-th column, where n is an integer greater than or equal to 0.

10. The display substrate according to claim 9, wherein the first pixel opening region comprises a light emitting region and a non-light emitting region, and the second pixel opening region only comprises a light emitting region; an orthographic projection of the light emitting region on the substrate is overlapped with an orthographic projection of a first electrode on the substrate, and an orthographic projection of the non-light emitting region on the substrate is not overlapped with an orthographic projection of the first electrode on the substrate.

11. The display substrate according to claim 2, further comprising a plurality of light emitting units, each light emitting unit comprising at least three sub-pixels, each sub-pixel comprising the light emitting structure layer disposed on the side of the drive circuit layer away from the substrate, widths of first electrodes of adjacent sub-pixels along the first direction are different, the first electrodes of all sub-pixels are disposed in a matrix along the first direction and the second direction, distances between the first electrodes of adjacent rows are equal, and distances between the first electrodes of adjacent columns are equal.

12. The display substrate according to claim 2, wherein a width of the second pixel opening region along the first direction is between ⅓ and ⅔ of a width of the first pixel opening region along the first direction.

13. The display substrate according to claim 1, wherein a height of the first retaining wall is less than or equal to 1 micron, and a height of the second retaining wall is 1.2 microns to 1.5 microns.

14. The display substrate according to claim 1, wherein the first retaining wall is made of a lyophilic material and the second retaining wall is made of a lyophobic material.

15. A display apparatus, comprising the display substrate of claim 1.

16. A method for preparing a display substrate, comprising:
forming a drive circuit layer comprising a transistor on a substrate;
forming a light emitting structure layer on the drive circuit layer, wherein the light emitting structure layer comprises a first electrode, a pixel define layer, an organic light emitting layer and a second electrode, wherein the first electrode is connected with a drain electrode of the transistor, and the organic light emitting layer is located between the first electrode and the second electrode; the pixel define layer comprises a plurality of first retaining walls and a plurality of second retaining walls, wherein a height of the first retaining walls is less than a height of the second retaining walls; the first retaining walls and the second retaining walls are intersected to define a plurality of pixel opening regions; the pixel opening regions comprises a first pixel opening region and a second pixel opening region; an area of the first pixel opening region is larger than an area of the second pixel opening region;
and the first pixel opening region and the second pixel opening region adjacent to each other are separated by a first retaining wall,
wherein the second retaining walls comprise a first sub-retaining wall and a second sub-retaining wall disposed at intervals, wherein the first sub-retaining wall is provided with a plurality of first bending parts and a plurality of second extending parts which are alternately disposed; the first bending parts extend in a first direction, and the second extending parts extend in a second direction.

17. The preparation method according to claim 16, wherein forming the light emitting structure layer on the drive circuit layer, comprises:
forming a pattern of the first electrode on the drive circuit layer;
forming a pattern of the pixel define layer through a halftone mask patterning process;
forming a pattern of the organic light emitting layer through an inkjet printing process, wherein during inkjet printing, organic light emitting layer material ink is only printed to the first pixel opening region; and
forming a pattern of the second electrode on the organic light emitting layer.

18. The preparation method according to claim 16, wherein forming the light emitting structure layer on the drive circuit layer, comprises:
forming a pattern of the first electrode on the drive circuit layer;
forming a pattern of the first retaining wall in the pixel define layer through a monochromatic mask patterning process;
forming a pattern of the second retaining wall in the pixel define layer through a second monochromatic mask patterning process;
forming a pattern of the organic light emitting layer through an inkjet printing process, wherein during inkjet printing, the organic light emitting layer material ink is only printed to the first pixel opening region; and
forming a pattern of the second electrode on the organic light emitting layer.

19. The preparation method according to claim 17, wherein forming the pattern of the organic light emitting layer through the inkjet printing process comprises any one or more of the following:
- inkjet printing hole injection material ink on the first pixel opening region, allowing the hole injection material ink to flow to the second pixel opening region adjacent to the first pixel opening region, removing a solvent of the hole injection material ink by drying, and baking to form a hole injection layer pattern;
- inkjet printing hole transport material ink on the first pixel opening region, allowing the hole transport material ink to flow to the second pixel opening region adjacent to the first pixel opening region, removing a solvent of the hole transport material ink by drying, and baking to form a hole transport layer pattern; and
- inkjet printing luminescent material ink on the first pixel opening region, allowing the luminescent material ink to flow to the second pixel opening region adjacent to the first pixel opening region, removing a solvent of the luminescent material ink by drying, and baking to form the pattern of the light emitting layer.

20. The preparation method according to claim 16, wherein the second retaining walls extend along thea second direction, the plurality of second retaining walls are disposed in sequence along athe first direction, and the plurality of first retaining walls are disposed in sequence along the second direction between two adjacent second retaining walls, wherein the first direction and the second direction are intersected.

* * * * *